(12) United States Patent
Schubert et al.

(10) Patent No.: US 10,062,803 B2
(45) Date of Patent: Aug. 28, 2018

(54) MICRO-SIZE DEVICES FORMED BY ETCH OF SACRIFICIAL EPITAXIAL LAYERS

(71) Applicant: X Development LLC, Mountain View, CA (US)

(72) Inventors: Martin F. Schubert, Mountain View, CA (US); Jason D. Thompson, Palo Alto, CA (US); Michael Grundmann, San Jose, CA (US)

(73) Assignee: X Development LLC, Mountain View, CA (US)

( * ) Notice: Subject to any disclaimer, the term of this patent is extended or adjusted under 35 U.S.C. 154(b) by 5 days.

(21) Appl. No.: 15/083,919

(22) Filed: Mar. 29, 2016

(65) Prior Publication Data

US 2017/0288087 A1    Oct. 5, 2017

(51) Int. Cl.
  *H01L 21/311*   (2006.01)
  *H01L 33/00*    (2010.01)
  *H01L 33/32*    (2010.01)

(52) U.S. Cl.
  CPC ........ *H01L 33/007* (2013.01); *H01L 33/0079* (2013.01); *H01L 33/0095* (2013.01); *H01L 33/32* (2013.01)

(58) Field of Classification Search
  CPC .............................. H01L 33/00; H01L 33/32
  See application file for complete search history.

(56) References Cited

U.S. PATENT DOCUMENTS

| 7,683,380 | B2 | 3/2010 | Lee et al. | |
| 8,921,227 | B2 | 12/2014 | Toba | |
| 9,059,339 | B1* | 6/2015 | Bayram | H01L 33/0079 |
| 9,666,677 | B1* | 5/2017 | Raring | H01L 29/205 |
| 2012/0244683 | A1 | 9/2012 | Akagi | |
| 2013/0320386 | A1* | 12/2013 | Schubert | H01L 33/0079 257/99 |
| 2014/0065746 | A1 | 3/2014 | Seong | |
| 2014/0094878 | A1 | 4/2014 | Gossler et al. | |
| 2015/0140710 | A1* | 5/2015 | McLaurin | H01S 5/34333 438/31 |
| 2015/0228631 | A1 | 8/2015 | Ray et al. | |
| 2016/0104819 | A1 | 4/2016 | Schmid et al. | |

FOREIGN PATENT DOCUMENTS

| KR | 2011-0130966 A | 12/2011 |
| KR | 2012-0121607 A | 11/2012 |
| KR | 2013-0035685 A | 4/2013 |

OTHER PUBLICATIONS

International Application No. PCT/US2016/067364—International Search Report and Written Opinion dated Mar. 29, 2017, 18 pages.

* cited by examiner

*Primary Examiner* — Asok K Sarkar
*Assistant Examiner* — Dmitriy Yemelyanov
(74) *Attorney, Agent, or Firm* — Christensen O'Connor Johnson Kindness PLLC

(57) ABSTRACT

Embodiments regard micro-size devices formed by etch of sacrificial epitaxial layers. An embodiment of a method includes forming a plurality of epitaxial layers on a sapphire crystal, wherein the epitaxial layers include a buffer layer on the sapphire crystal, a sacrificial layer above the buffer layer, and one or more device layers above the sacrificial layer; etching to singulate the semiconductor devices, the etching being through the one or more device layers and wholly or partially through the sacrificial layer; electrochemical etching of the sacrificial layer; and lift-off of one or more semiconductor devices from the buffer layer.

17 Claims, 12 Drawing Sheets

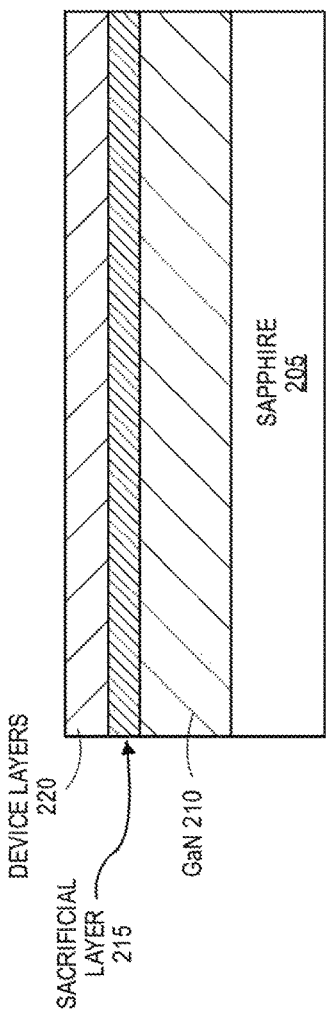
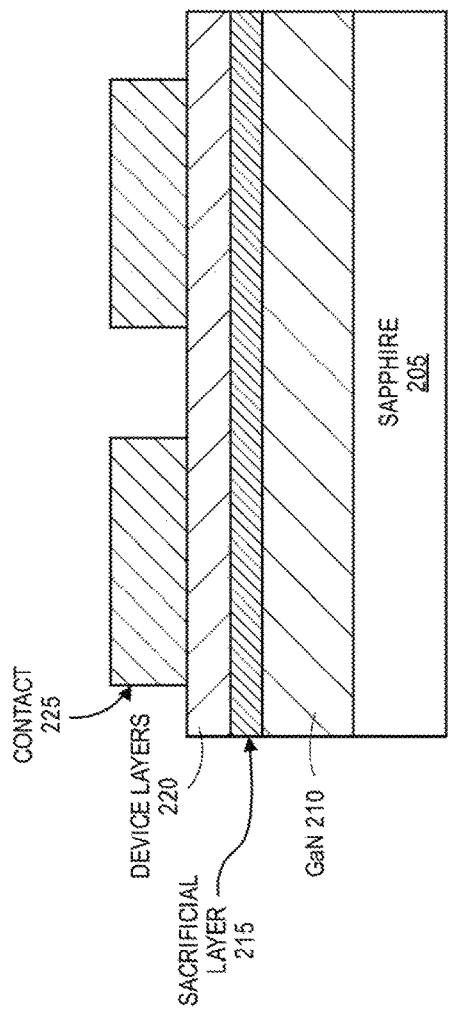

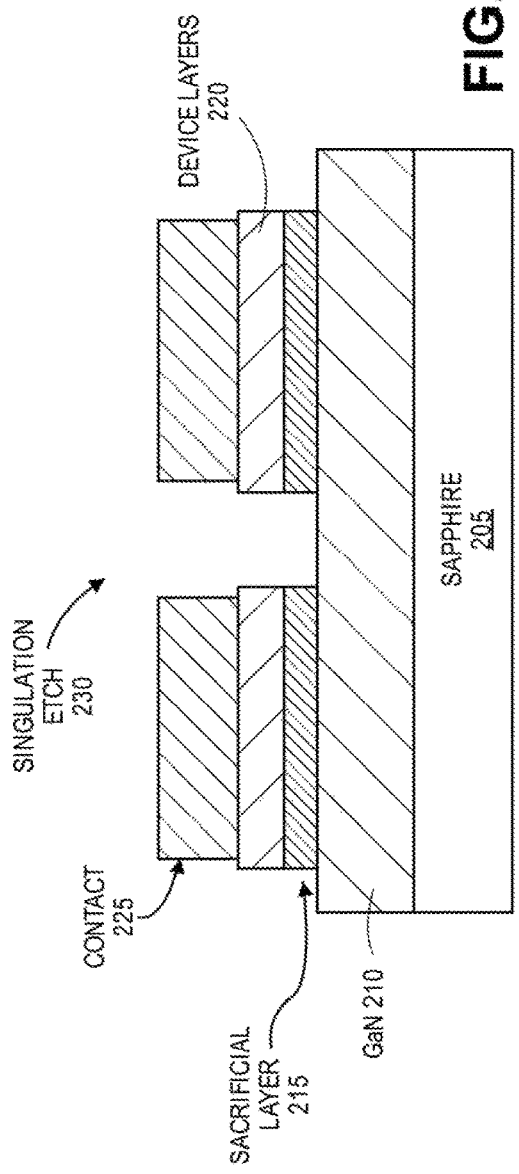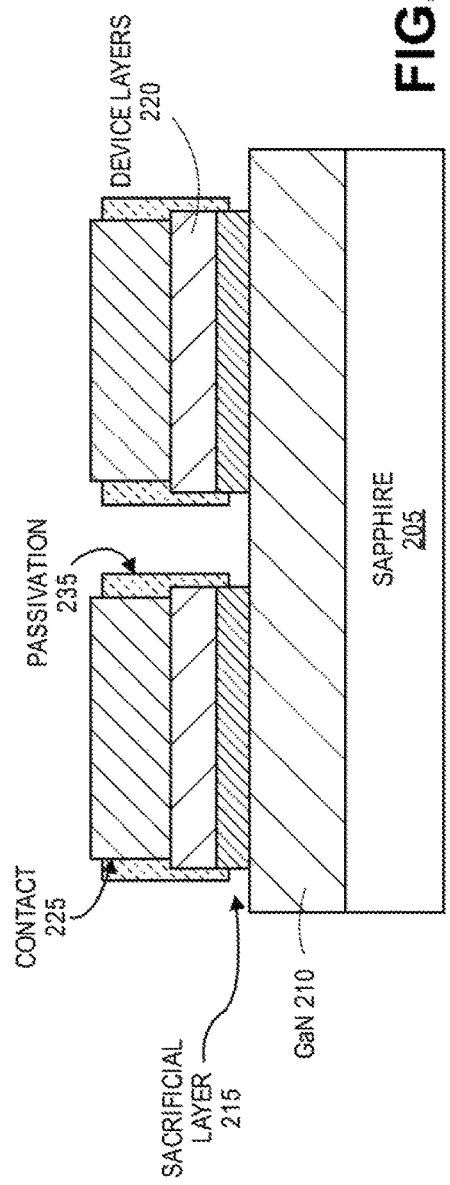

MICRO-SIZE DEVICES FORMED BY ETCH OF SACRIFICIAL EPITAXIAL LAYERS

TECHNICAL FIELD

This disclosure relates generally to electronic devices, and in particular but not exclusively, relates to micro-size devices formed by etch of sacrificial epitaxial layers.

BACKGROUND INFORMATION

In the fabrication of semiconductor devices, such as light emitting diodes (LEDs), a process may include the generation of epitaxial layers on a virtual substrate, such as GaN (gallium-nitride) grown on a sapphire crystal (which may be referred to as a GaN-sapphire substrate). Upon completion of the fabrication of the layers on the GaN-sapphire substrate, the epitaxial layers may be etched between individual devices to singulate the devices.

Laser lift-off is the most common commercial approach for substrate removal in GaN-based devices. In this conventional operation, a laser with an appropriate wavelength is fired through the sapphire crystal, and light is absorbed at the sapphire/GaN interface. The laser operation causes local heating and delamination of the GaN from the sapphire. Further, electrochemical etch has been used for undercutting layers of GaN. Non-native sacrificial layers (such as ZnO—zinc oxide) have also been used to facilitate chemical lift-off.

However, the conventional fabrication process requires the singulation etching down to the sapphire surface of the virtual substrate, and the separation of the GaN material from the sapphire crystal. This processing limits the productive yield of the device fabrication, as well as limiting the possible geometry of devices that are produced.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

FIG. 2A is an illustration of epitaxial growth of a wafer according to an embodiment;

FIG. 2B is an illustration of first contact deposition in a semiconductor device according to an embodiment;

FIG. 2C is an illustration of singulation etching between generated devices according to an embodiment;

FIG. 2D is an illustration of passivation in a generated device according to an embodiment;

DETAILED DESCRIPTION

Figure 1:
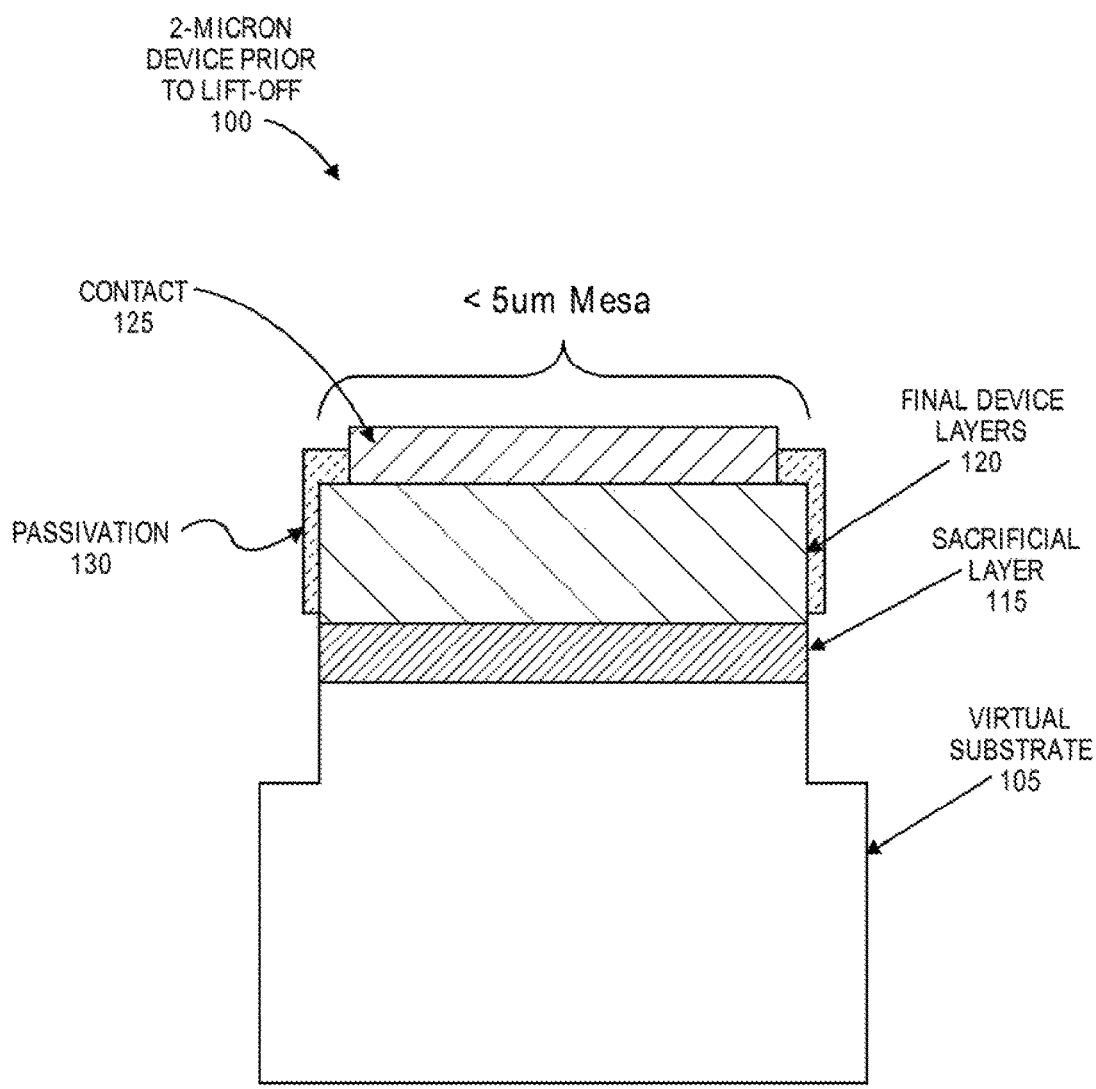
FIG. 1 is an illustration of emitter device prior to lift-off from a virtual substrate according to an embodiment.

Embodiments of an apparatus, system, and process for micro-size devices formed by etch of sacrificial epitaxial layers.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In some embodiments, an apparatus, system, or process provides for micro-size devices formed by etching of sacrificial epitaxial layers. In some embodiments, an apparatus, system, or process allows for generation of devices utilizing electrochemical etching of sacrificial epitaxial layers, without the requirement of deep singulation etching for the separation of devices from a substrate.

In some embodiments, micro semiconductor devices are generated in a process including epitaxial growth of a substrate. The semiconductor devices may include, but are not limited to, a light-emitting diode (LED), an LED in general being is a two-lead semiconductor light source device including a p-n junction diode that produces light (releasing energy in the form of photons through the process of electroluminescence) when activated by a certain voltage.

In a conventional semiconductor fabrication process, lateral feature dimensions that can be achieved are limited. With conventional fabrication techniques it is possible to realize a laterally-small, vertically-shallow trench, or a laterally-large, vertically-deep trench, but creation of a laterally-small, vertically-deep trench is more difficult. A structure with a laterally-small (along the X and Y axes), vertically-deep (along the Z axis) dimensions may be referred herein as a high-aspect-ratio structure.

The difficulty in forming high-aspect-ratio structures arises for a variety of reasons, including, for example, the typical need to use thick resist when creating deep trenches between devices, resist mask consumption during etch processes, and (in, for example, a dry etch) plasma directionality. The difficulty of creating high-aspect-ratio structures limits the minimum lateral feature size in a case where a certain depth is achieved. An example is in the formation of GaN-based LED devices grown on sapphire crystals, where a singulation etch down to the sapphire is conventionally needed to facilitate a laser lift-off step for the fabricated devices.

In the particular case of LED devices, while it is possible to form thinner (along the Z axis) LED structures, in general there is a strong relationship between the quality of an LED and its thickness because LEDs are typically grown on non-native substrates. As a result, there tend to be defects at the interface between the substrate and the epitaxial grown films on the substrate. As thicker material is grown, these defects tend to annihilate, allowing for better performance.

For at least these reasons, it is difficult using conventional approaches to form small-area, high-quality LED devices.

In some embodiments, an apparatus, system, or process circumvents these issues in conventional processing by utilizing an epitaxial growth sacrificial layer that does not require singulation etching down to sapphire crystal for device lift-off, but rather utilizes a comparatively shallow etch to access the sacrificial layer for etching of such layer. In some embodiments, an apparatus, system, or process enables device lift-off and allows the creation of micro-scale emitters with smaller feature size than a conventional approach. In some embodiments, a process is provided for forming a micro emitter device, including a micro LED.

In some embodiments, the process includes the formation of a sacrificial layer in the epitaxy process, the subsequent processing to form the device and expose the sacrificial layer, followed by an electrochemical etch of the sacrificial layer to undercut the micro LED devices. Epitaxy refers to the deposition of a crystalline overlayer on a crystalline substrate, wherein the overlayer is referred to as an epitaxial film or epitaxial layer.

In some embodiments, an apparatus, system, or process further allows for less wasted area between the emitters in comparison with conventional processes, with the better area efficiency assisting in reducing fabrication costs for semiconductor emitter devices. The lower aspect ratio provided by an embodiment allows for processing with greater area-efficiency (i.e., more dies may be produced per wafer).

In some embodiments, a final geometry of an emitter device produced by an embodiment of a process may be improved as compared to devices that are produced with a conventional laser lift-off method. Specifically, a sidewall area may be significantly reduced because of a reduction in total thickness. This modification in geometry provides subsidiary advantages, including, for example, decreasing the probability that an emitter will sit on its side when dispensed via a spray method, fluidic assembly or self-assembly approach, or other method. The suitability of an emitter for this type of dispense method is a key and desirable attribute.

In certain embodiments, the electrochemical etch of a sacrificial epitaxial layer may be adjusted so that it (1) completely removes the sacrificial layer or (2) partially removes the sacrificial layer to form a porous network in the sacrificial layer. In the case where a porous network is formed, mechanical force could be applied to remove the individual emitters from the substrate as needed.

In certain embodiments, the micro emitter devices generated in a process are further supported by a structure (such as a temporary carrier wafer) during the sacrificial layer etching process, such that the micro devices remain in place following the lift-off step. In alternate embodiment, the micro devices may be recovered from the bath following the lift-off etch. In the case of the porous network etch, sepa-ration could occur by some mechanical force, such as pressure or shear forces, or forces induced by ultrasonic agitation.

In some embodiments, an embodiment utilizes a heavily-doped N-type GaN layer as a sacrificial layer electrochemical etching. Doping refers to introduction of impurities into intrinsic semiconductor to modulate electrical properties. It is known that a heavily doped GaN layer is highly responsive to electrochemical etching, while P-type and undoped GaN layers are not etched. (See, for example, "Doping Selective Lateral Electrochemical Etching of GaN for Chemical Lift-off", Park, et al., Appl. Phys. Lett. 94, 221907 (2009)). In this manner, a heavily-doped layer may be provided that is highly responsive to electrochemical etching, where such material will provide much greater etch rate at a particular voltage than other materials.

In some embodiments, an apparatus, system, or process allows for the recovery of a GaN-on-sapphire wafer after the processing of emitter devices, which then may be used as the template for further epitaxial growth (i.e. the buffer need not be regrown).

In some embodiments, generated micro LED devices may be implemented in micro-LED displays or any other applications utilizing small size light-emitters.

FIG. 1 is an illustration of emitter device prior to lift-off from a virtual substrate according to an embodiment. As illustrated in FIG. 1, a process may include formation of a mesa of less than 5 μm (micron, or micrometer) in width, including the generation of devices such as the illustrated 2-micron width device 100. Additional details regarding the fabrication of such devices may be as illustrated in, for example, FIGS. 2A-2G and 3A-3D.

In some embodiments, a semiconductor device 100, illustrated prior to lift-off of the device from the substrate, includes the following:

105: A virtual substrate 105, such as a generated GaN-sapphire substrate.

110: A sacrificial epitaxial layer for use in lifting off the semiconductor device 100 after such device is formed. In some embodiments, the sacrificial layer is a layer that responds to electrochemical etching, which may include wavelength-selective photoelectrochemical etching, to allow for removal of the sacrificial layer while maintaining the GaN-sapphire substrate. In some embodiments, the sacrificial layer 110 may include, but is not limited to:

(1) InGaN (Indium Gallium Nitride) or InGaN/InGaN superlattice, wherein examples may include, but are not limited to:

(a) 3>20/20 nm (nanometer) $In_{0.04}GaN/In_{0.07}GaN$, or (b) 120 nm $In_{0.07}GaN$.

(2) GaN:Si (Silicon-doped Gallium Nitride) (high [Si]).

115: Final device layers (which may be <1 μm thick), where such device layers may include an N-type material layer, an active layer (such as a light emitting layer), and a P-type material layer. In some embodiments, the final device layers may include sidewall passivation 130, wherein a protective material is provided prior to etching of a sacrificial layer.

125: A contact for the emitter device, wherein a second contact may be deposited subsequent to lift-off of the device from the substrate.

A conventional method for forming GaN-based micro-LEDs commonly includes laser lift-off following a singulation etch down to the sapphire crystal of the substrate. In some embodiments, a singulation etch of this depth is not required because the inclusion of the sacrificial epitaxial layer allows lift-off of emitter devices using electrochemical etch, which may include wavelength-selective photoelectrochemical etching, and thus all that is required is a singulation etch wholly or partially through the sacrificial layer.

A process for generation of micro emitter devices according to an embodiment may as illustrated in FIGS. 2A-2G.

FIG. 2A is an illustration of epitaxial growth of a wafer according to an embodiment. As illustrated, a virtual substrate includes GaN 210 formed on sapphire 205. In some embodiments, the epitaxial growth of the wafer may further include generation of a sacrificial layer 215 for electrochemical etching, which may include wavelength-selective photoelectrochemical etching. The generation of the wafer further includes formation of active device layers 220, such as an N-type layer, an active layer, and a P-type layer, wherein an active layer may include, but is not limited to, a light emitting layer for an LED device.

FIG. 2B is an illustration of first contact deposition in a semiconductor device according to an embodiment. In some embodiments, first contacts 225 for semiconductor devices are deposited on the generated device layers 220.

FIG. 2C is an illustration of singulation etching between generated devices according to an embodiment. In some embodiments, wherein a singulation etch 230 is made between generated semiconductor devices, wherein the etching is limited to etching partially or wholly through the sacrificial layer 215. In some embodiments, the singulation etching may be made without etching through the GaN layer to the sapphire crystal, as is commonly required for singulation of devices in a conventional process. In this matter, the GaN-sapphire structure is maintained, and may potentially be processed and utilized for one or more additional epitaxial growth processes.

FIG. 2D is an illustration of passivation in a generated device according to an embodiment. In some embodiments, subsequent to the singulation etching as illustrated in FIG. 2C, a passivation layer 235 may be applied to the resulting side-cuts of the semiconductor devices, wherein the passivation 235 provides a protective layer for the device layers 220 and contacts 225 of the semiconductor devices.

Figure 2E:
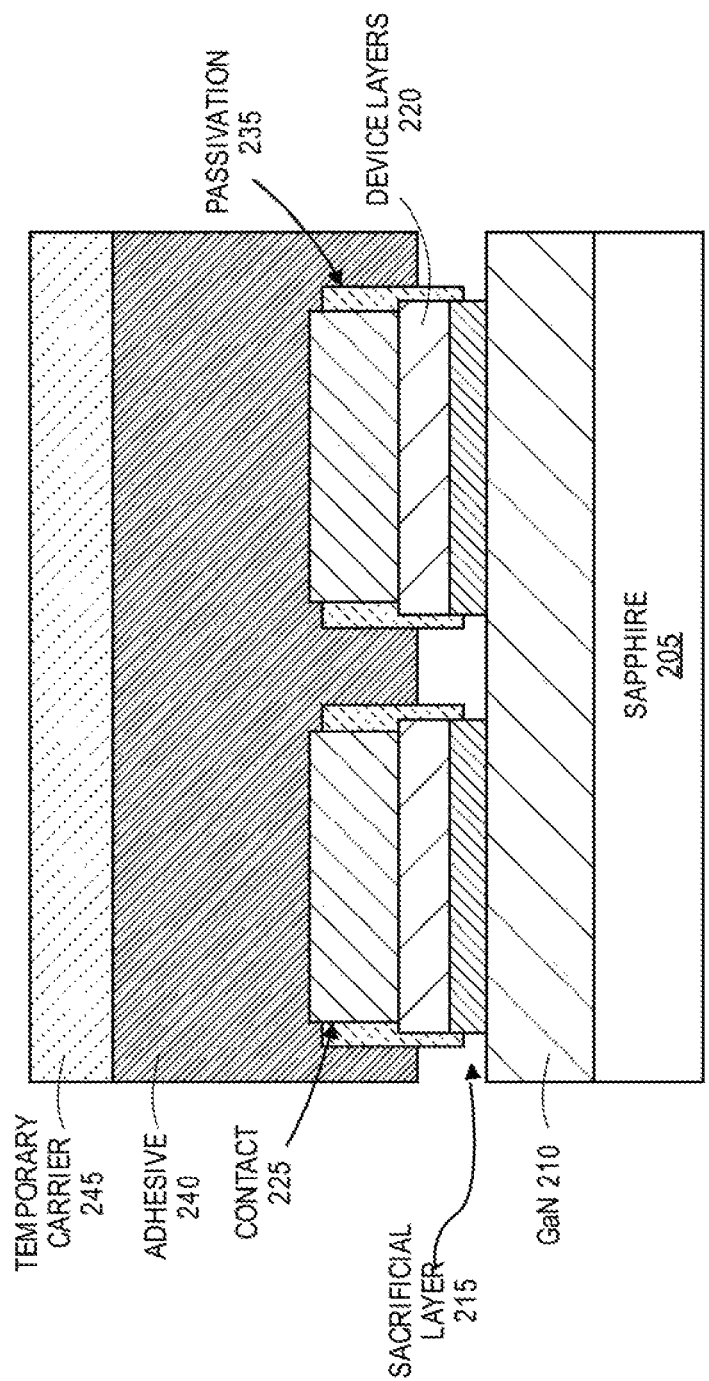
FIG. 2E is an illustration of carrier attachment for generated semiconductor devices according to an embodiment.

FIG. 2E is an illustration of carrier attachment for generated semiconductor devices according to an embodiment. In some embodiments, a temporary carrier 245 may be optionally attached to the singulated semiconductor devices by an adhesive 240. In some embodiments, the carrier 245 is attached prior to electrochemical etching of the sacrificial layer 215 to secure the semiconductor devices subsequent to lift-off of the devices from the substrate.

Figure 2F:
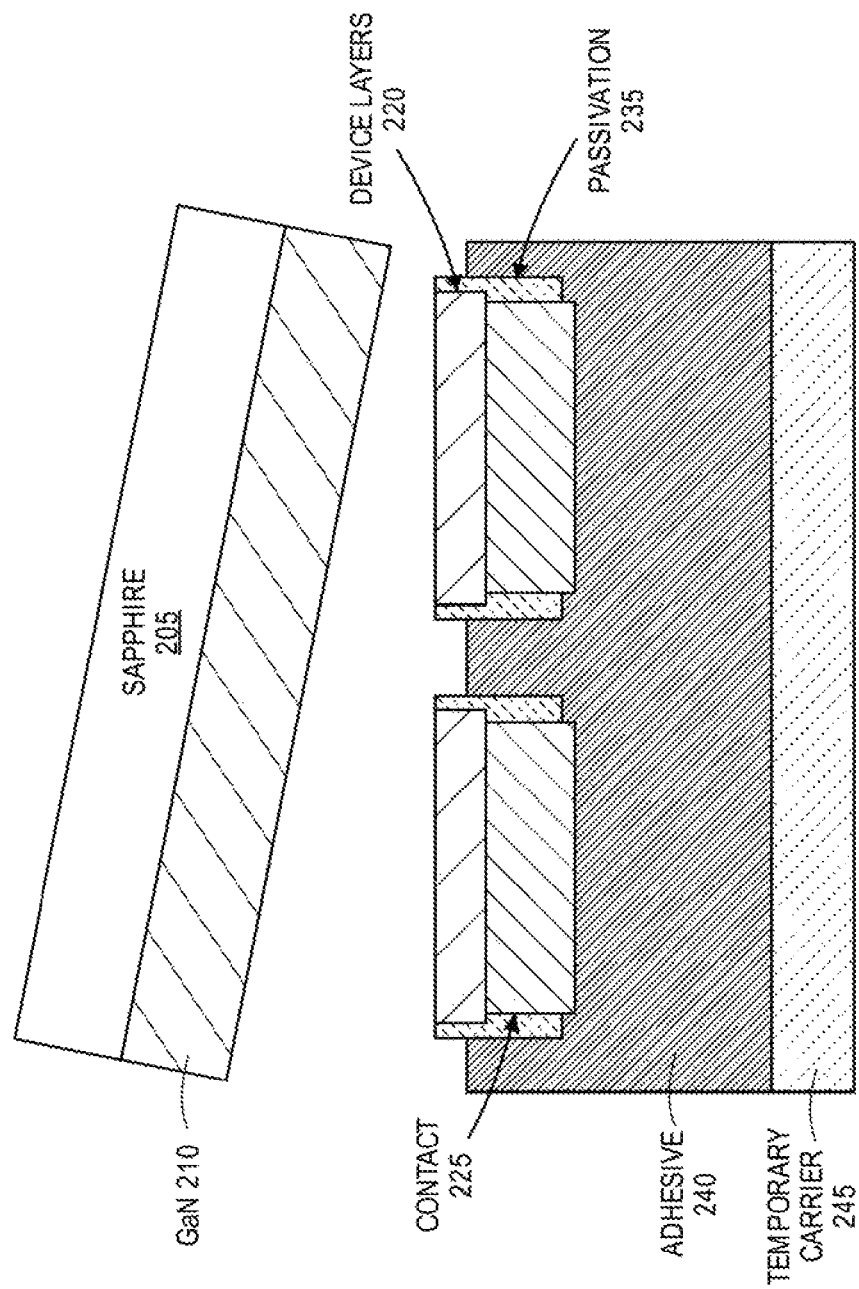
FIG. 2F is an illustration of semiconductor device lift-off following etching of a sacrificial layer according to an embodiment.

FIG. 2F is an illustration of semiconductor device lift-off following etching of a sacrificial layer according to an embodiment. In some embodiments, electrochemical lift-off etching of the sacrificial layer 215 follows the attachment of the temporary carrier 245 (shown in FIG. 2E). In some embodiments, subsequent to lift-off etching of the sacrificial layer using photoelectrochemical or electrochemical etching, the GaN-Sapphire substrate 210-205 is removed, with the singulated devices being secured by the temporary carrier 245.

Figure 2G:
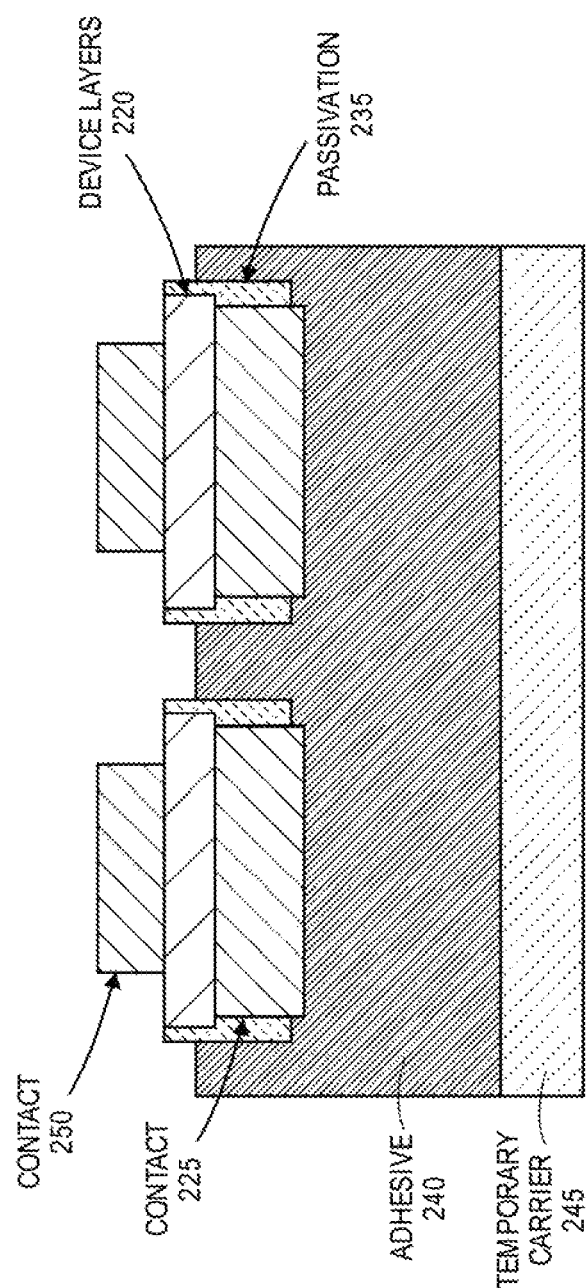
FIG. 2G is an illustration of a second contact deposition for semiconductor devices according to an embodiment.

FIG. 2G is an illustration of a second contact deposition for semiconductor devices according to an embodiment. In some embodiments, subsequent to the lift-off etching of the sacrificial layer and the lift-off of the semiconductor devices, a process further includes the deposition of a second contact 250 on each of the generated devices. Following such process, the semiconductor devices may be removed by release of the temporary carrier 245.

In some embodiments, a process for the formation of emitter devices may further be as illustrated in FIGS. 3A-3D.

Figure 3A:
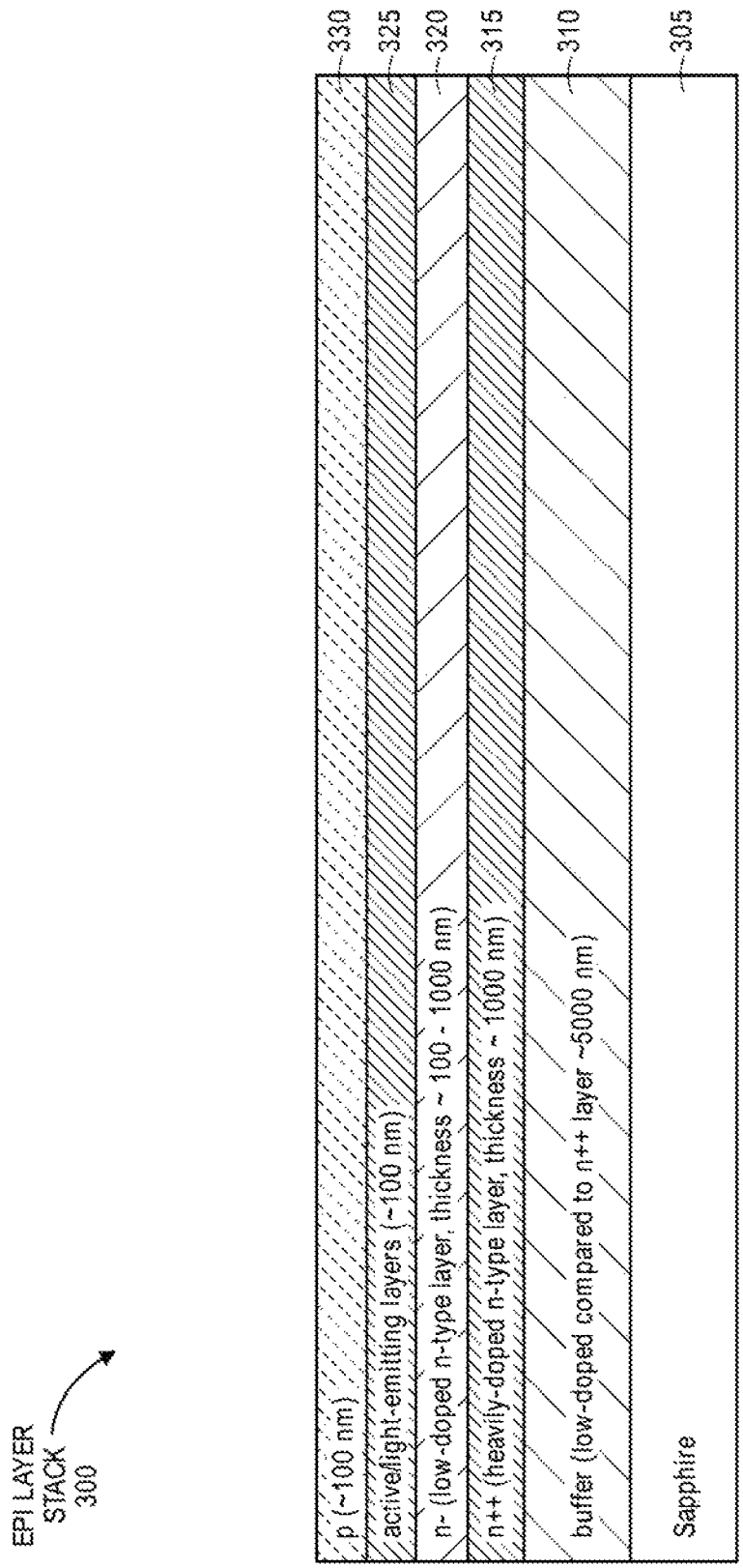
FIG. 3A is an illustration of an epitaxial layer stack for micro emitter devices according to an embodiment.

FIG. 3A is an illustration of an epitaxial layer stack for micro emitter devices according to an embodiment. In a particular implementation, as illustrated in FIG. 3A, the layers of an epitaxial layer stack include:

305: A sapphire crystal for the generation of the substrate.

310: A buffer GaN layer, the buffer layer being a low-doped N-type layer (which is relatively unresponsive to electrochemical etching at a certain voltage), wherein the buffer may be approximately 5000 nm (5 microns) in thickness in a particular implementation.

315: A sacrificial layer, the sacrificial layer being a heavily doped N-type (N++) layer, wherein the sacrificial layer may be between 50 nm and 1000 nm (a micron) in thickness in a particular implementation. In some embodiments, the sacrificial layer 315 is highly responsive to electrochemical etching at a certain voltage. In general, the sacrificial layer is more heavily doped than the other layers of the epitaxial layer stack. In some embodiments, a sacrificial layer includes a material having an intrinsic carrier (electron or hole) concentration of greater than $5.0 \times 10^{19}$ cm$^{-3}$ at 300 Kelvin.

320: In some embodiments, the epi layer stack 300 may further include an N-type material device layer, the layer being a low-doped GaN layer. The N-type device layer may be approximately 100 to 1000 nm in thickness in a particular implementation.

325: An active device layer, such as a light emitting layer of an LED device, wherein the active device layer may be approximately 100 nm in thickness in a particular implementation.

330: P-type material layer of the semiconductor device, wherein the P-type device layer may be approximately 100 nm in thickness in a particular implementation.

Figure 3B:
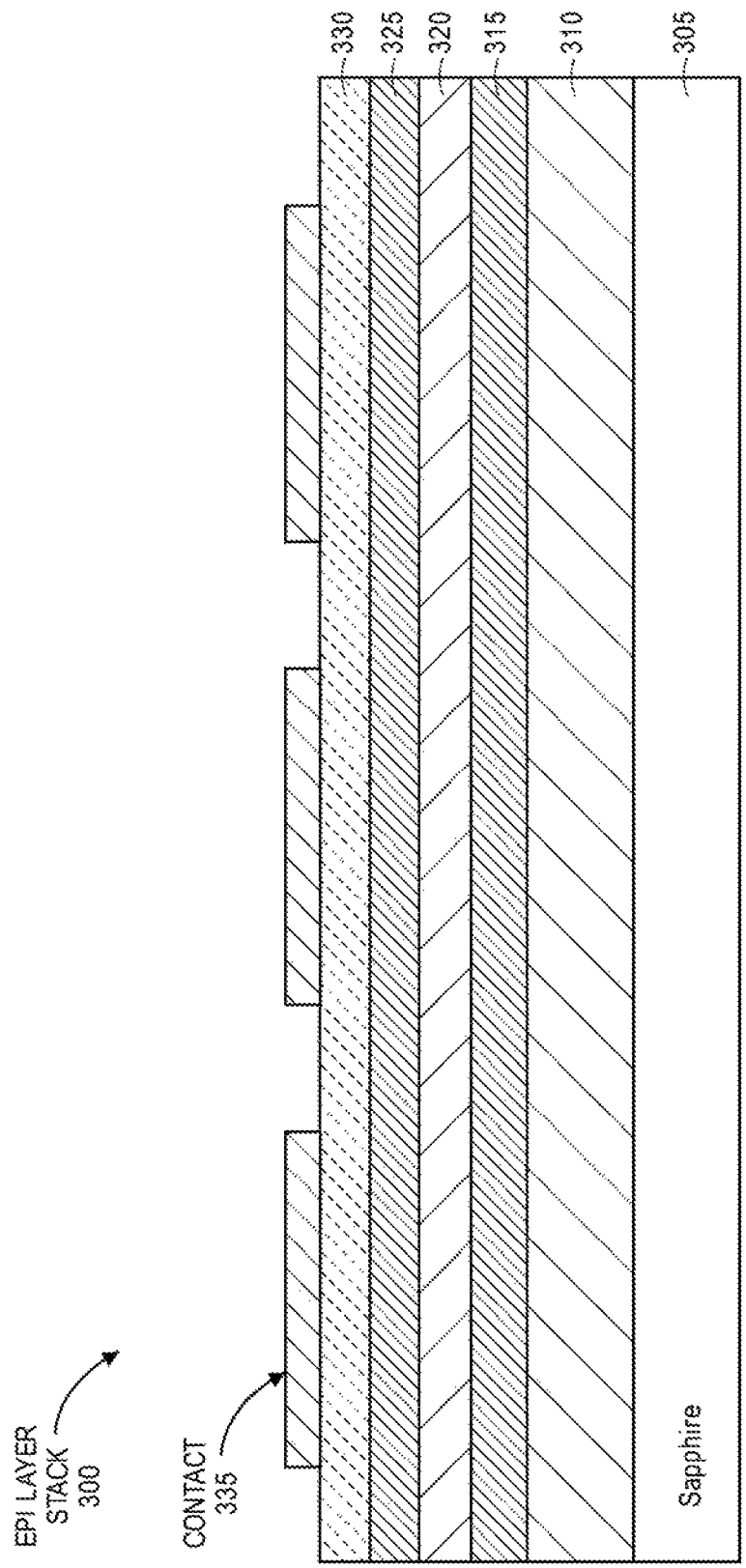
FIG. 3B is an illustration of contact deposition for micro emitter devices according to an embodiment.

FIG. 3B is an illustration of contact deposition for micro emitter devices according to an embodiment. In some embodiments, as illustrated in FIG. 3B, contacts for the emitter devices are deposited on the epitaxial layers of the epitaxial layer stack 300.

Figure 3C:
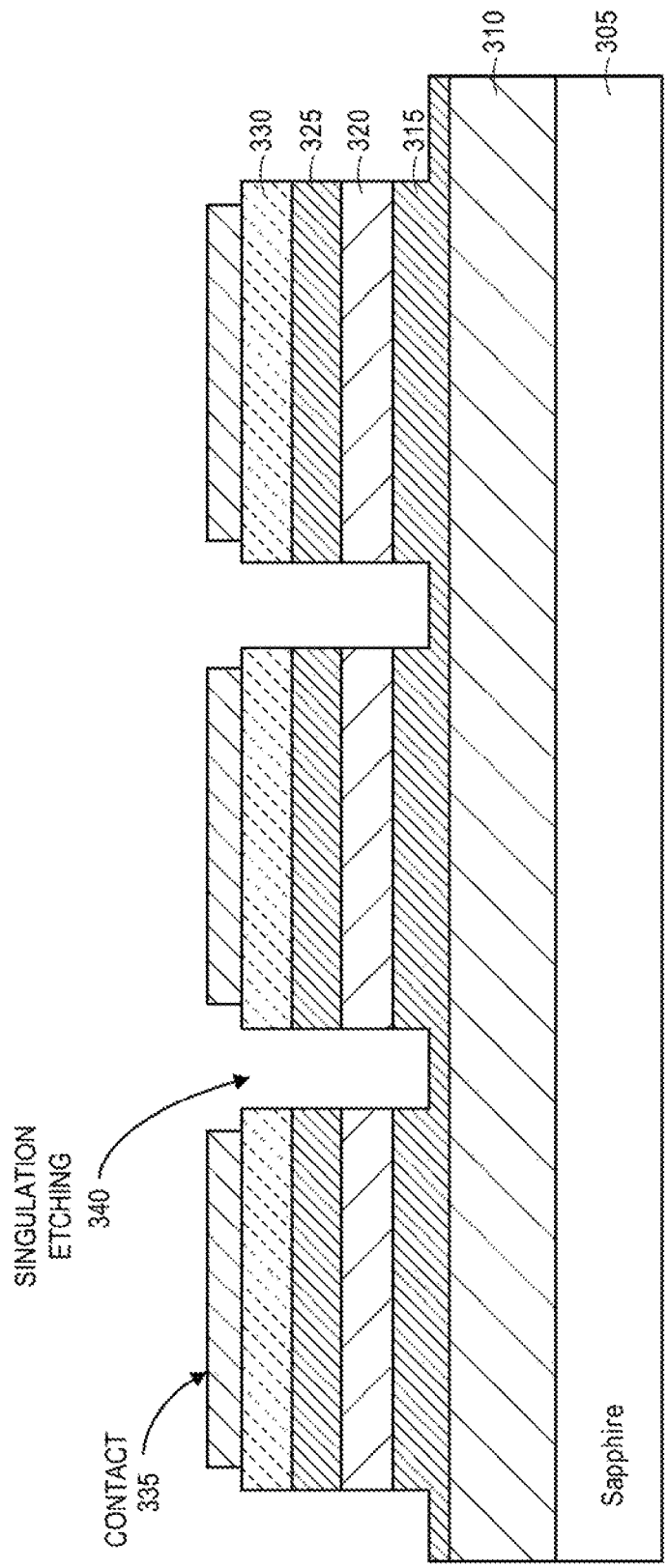
FIG. 3C is an illustration of singulation etching of epitaxial layers according to an embodiment.

FIG. 3C is an illustration of singulation etching of epitaxial layers according to an embodiment. In some embodiments, as illustrated in FIG. 3C, a process includes singulation etching 340 partially or wholly through the N++ sacrificial layer 315. In contrast with a conventional apparatus, system, or process, the singulation etching of the epitaxial layers is not required to continue through the buffer layer 310 to the sapphire 305.

Figure 3D:
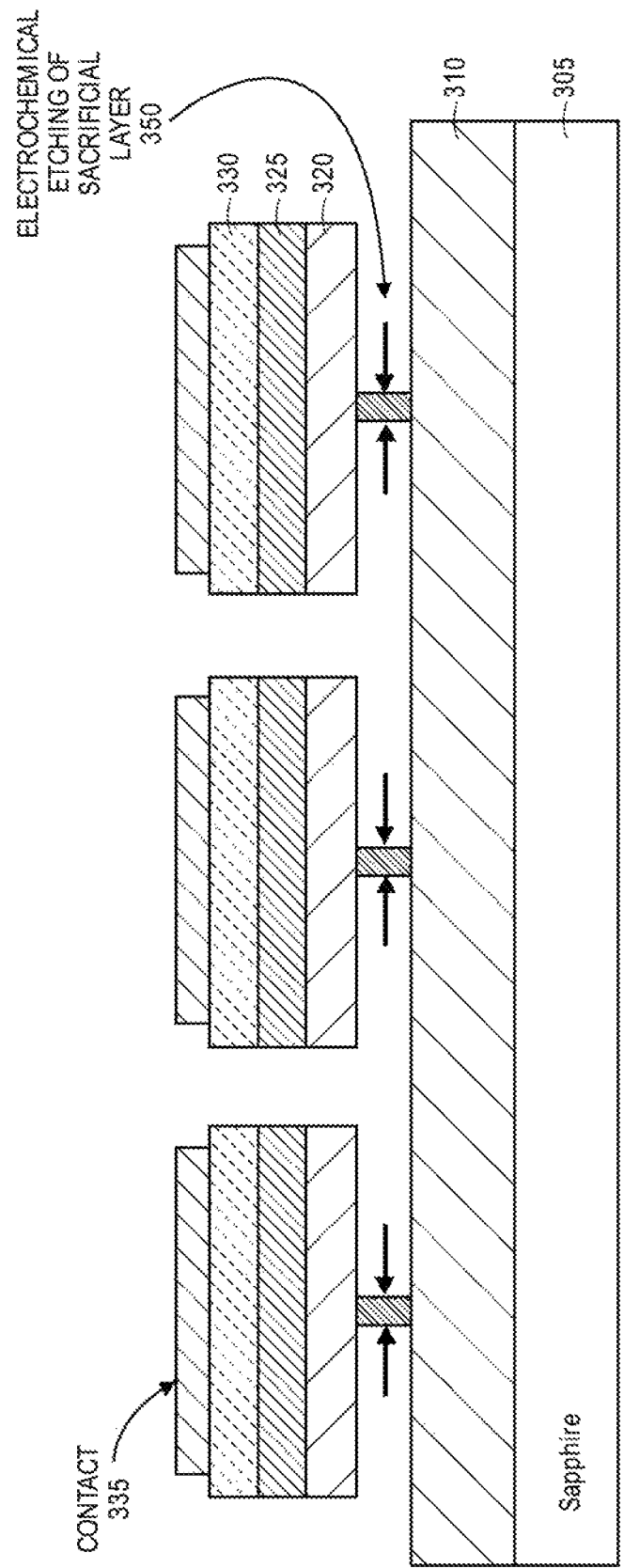
FIG. 3D is an illustration of electrochemical lift-off etching of an sacrificial epitaxial layer according to an embodiment.

FIG. 3D is an illustration of electrochemical lift-off etching of a sacrificial epitaxial layer according to an embodiment. In some embodiments, as illustrated in FIG. 3D, a process includes electrochemical lift-off etching 350 of the sacrificial epitaxial layers, wherein the electrochemical etching of the N++ sacrificial layer results in partial or complete removal of the sacrificial layers.

Figure 4:
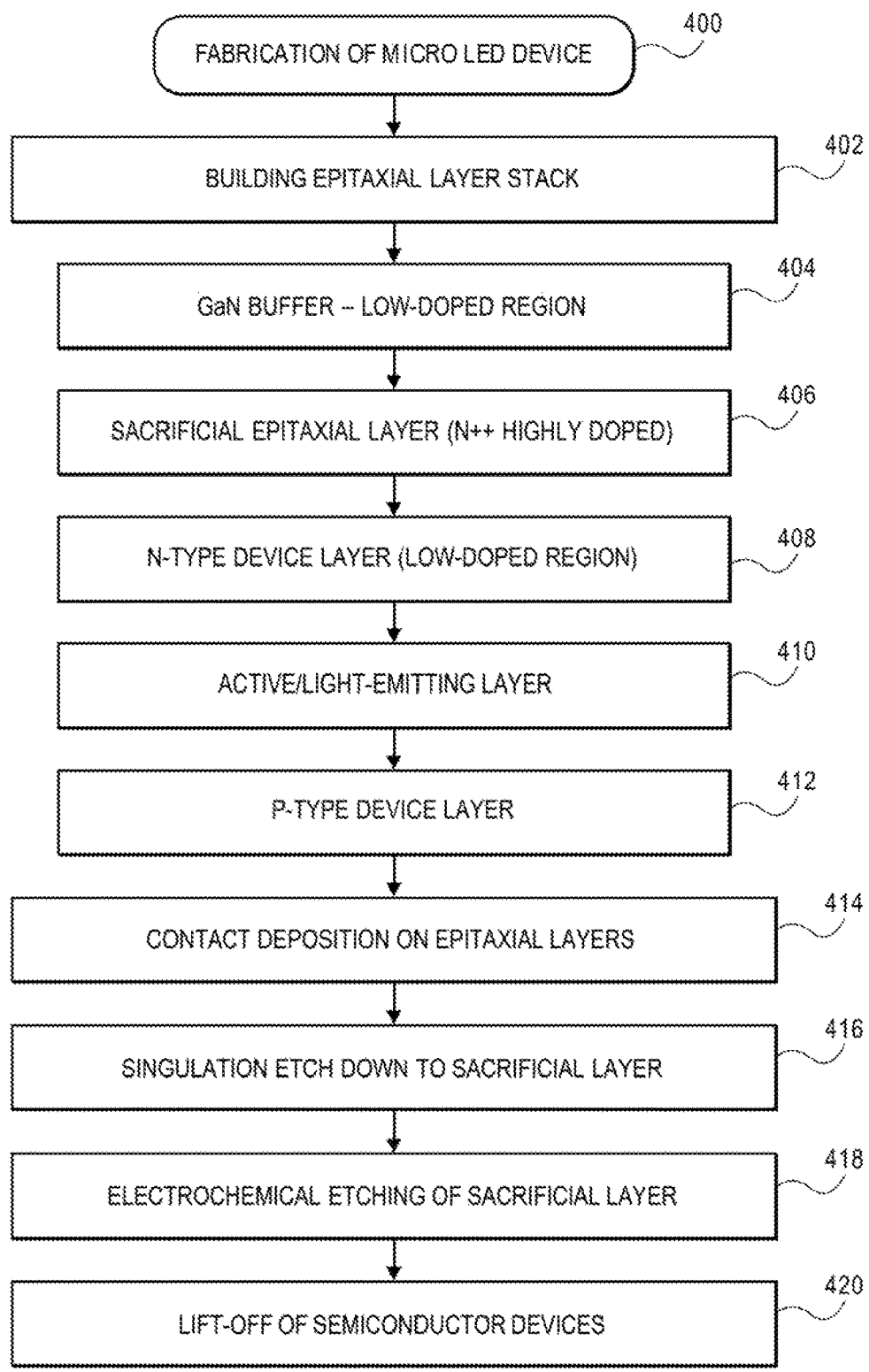
FIG. 4 is an illustration of a process for fabrication of micro emitter devices according to an embodiment.

FIG. 4 is an illustration of a process for fabrication of micro emitter devices according to an embodiment. In some embodiments, a process for fabrication of micro emitter devices 400 may include, but is not limited to, the following:

402: Building an epitaxial layer stack on a sapphire crystal, wherein the epitaxial layer may include:

404: A buffer layer on the sapphire crystal, wherein buffer layer may include a low-doped GaN region.

406: A sacrificial epitaxial layer, the sacrificial epitaxial layer being a layer that is responsive to electrochemical etching, which may include wavelength-selective photoelectrochemical etching. In some embodiments, a sacrificial layer includes a highly doped region.

408: An N-type material device layer. In some embodiments, the layer includes a low-doped region in comparison with the sacrificial epitaxial layer.

410: An active layer, including, but limited to, a light emitting layer for an LED device.

412: P-type semiconductor layer of the emitter devices.

414: In some embodiments, a process may further the depositing of contacts on the epitaxial grown layers.

416: In some embodiments, a process includes singulation etching down to the sacrificial layer, wherein the etching may include etching partially or wholly through the sacrificial layer.

418: In some embodiments, a process includes electrochemical or photoelectrochemical etching of the sacrificial epitaxial layer, wherein the etching may include partial or complete removal of the sacrificial layers.

420: In some embodiments, the process may proceed with the lift-off of the emitter devices.

Figure 5:
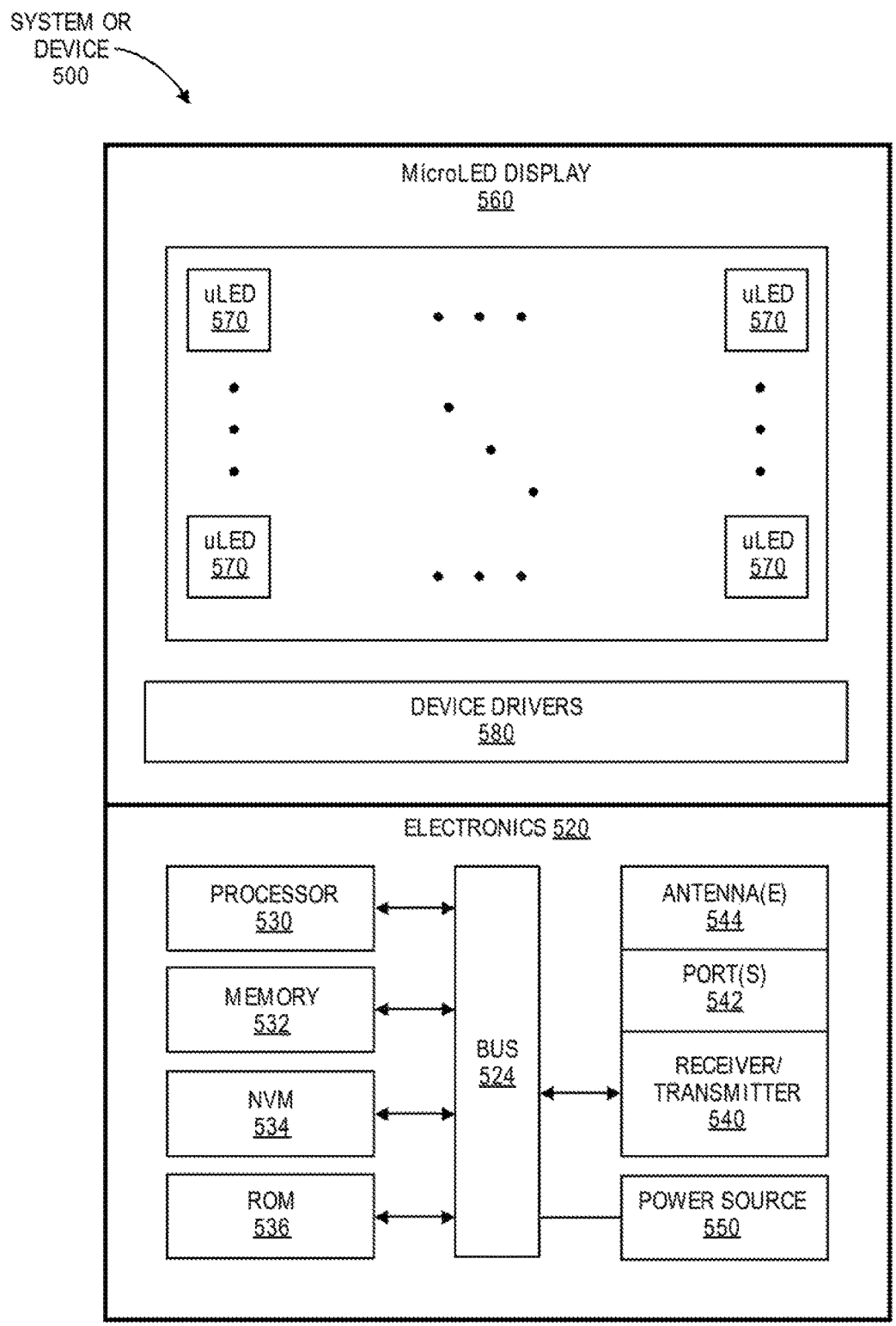
FIG. 5 is an illustration of a system or device including micro LED devices according to an embodiment.

FIG. 5 is an illustration of a system or device including micro LED devices according to an embodiment. FIG. 5 provides a particular example of a system or device, and embodiments are not limited to such an example.

In some embodiments, a system or device 500 includes, for example, a micro LED display 560 or other devices including the implementation of micro LED devices 570, wherein the micro LED devices may include a device as illustrated in FIG. 1, or a devices fabricate according processes illustrated in FIGS. 2A to 3D. In some embodiments, a micro LED display 560 may include device drivers 580 for the micro LED devices 570.

In some embodiments, the system or device 500 further includes certain system or device electronics 520. In some embodiments, the electronics 520 may further include one or more buses or interconnects for the connection of electrical components, shown in general as bus 524. The bus 524 is a communication means for transmission of data. The bus 524 is illustrated as a single bus for simplicity, but may represent multiple different interconnects or buses and the component connections to such interconnects or buses may vary. The bus 524 shown in FIG. 5 is an abstraction that represents any one or more separate physical buses, point-to-point connections, or both connected by appropriate bridges, adapters, or controllers.

In some embodiments, the supporting electronics 520 may include a processing means, shown as processor 530 coupled to the bus 524, to provide control instructions for the system or device. The processing means 530 may include one or more processors or controllers, including one or more physical processors and one or more logical processors. In some embodiments, the processing means 530 may include one or more general-purpose processors or special-processor processors.

In some embodiments, the electronics 520 further includes a random access memory (RAM) or other dynamic storage device or element as a main memory 532 for storing information and instructions to be executed by the processing means 530. In some embodiments, the electronics 520 also may further include a non-volatile memory 534; and a read only memory (ROM) 536 or other static storage device for storing static information and instructions for the processing means 530.

In some embodiments, the electronics 520 may include one or more transmitters or receivers 540 coupled to the bus 524. In some embodiments, the electronics 520 may include one or more antennae 544, such as dipole or monopole antennae, for the transmission and reception of data via wireless communication using a wireless transmitter, receiver, or both, and one or more ports 542 for the transmission and reception of data via wired communications. Wireless communication includes, but is not limited to, Wi-Fi, Bluetooth™, near field communication, and other wireless communication standards. Wired communication includes, but is not limited to, USB® (Universal Serial Bus) and FireWire® ports.

The electronics 520 may also include a battery or other power source 550, which may include a solar cell, a fuel cell, a charged capacitor, near field inductive coupling, or other system or device for providing or generating power in the supporting electronics 520. The power provided by the power source 550 may be distributed as required to elements of the electronics 520.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit (ASIC) or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method for fabricating semiconductor devices comprising:
    forming a plurality of epitaxial layers on a substrate, wherein the epitaxial layers include:
        a buffer layer disposed proximate to the substrate,
        a sacrificial layer disposed proximate to the buffer layer so that the buffer layer is disposed between the substrate and the sacrificial layer, wherein the sacrificial layer includes quantum wells with an In0.04GaN/In0.07GaN superlattice, and
        one or more device layers disposed proximate to the sacrificial layer so that the sacrificial layer is disposed between the buffer layer and the one or more device layers;

singulating the semiconductor devices via etching through the one or more device layers and wholly or partially etching through the sacrificial layer, wherein the etching through the sacrificial layer does not etch the buffer layer;

electrochemical etching of the sacrificial layer;

lift-off of the semiconductor devices from the buffer layer, wherein the one or more semiconductor devices includes one or more light emitting diode (LED) devices; and arranging the one or more LED devices into a display.

2. The method of claim 1, wherein the sacrificial layer includes GaN:Si (Silicon-doped Gallium Nitride).

3. The method of claim 1, wherein the one or more device layers are each less than 1 µm (micron) thick.

4. The method of claim 1, wherein the electrochemical etching includes completely removing the sacrificial layer.

5. The method of claim 1, wherein the electrochemical etching includes partially removing the sacrificial layer.

6. The method of claim 5, wherein the lift-off of the one or more semiconductor devices includes applying a mechanical force to remove the one or more semiconductor devices from the buffer layer.

7. The method of claim 1, further comprising applying a carrier wafer to support the one or more semiconductor devices during lift-off from the buffer layer.

8. The method of claim 1, wherein the electrochemical etching includes wavelength selective photoelectrochemical etching.

9. The method of claim 1, wherein the electrochemical etching includes etching at a certain voltage, the sacrificial layer being responsive to etching at the certain voltage.

10. The method of claim 1, wherein the sacrificial layer is between 50 nm (nanometers) and 1000 nm in thickness.

11. The method of claim 1, wherein the sacrificial layer includes a material having an intrinsic carrier concentration of greater than $5.0 \times 10^{19}$ cm$^{-3}$ at 300 Kelvin.

12. The method of claim 1, further comprising depositing of a contact on a semiconductor device prior to the lift-off of the semiconductor device from the buffer layer.

13. The method of claim 1, further comprising processing of the buffer and the substrate for further epitaxial growth.

14. The method of claim 1, wherein singulating the semiconductor devices includes separating individual semiconductor devices in the semiconductor devices from one another.

15. The method of claim 14, wherein the buffer layer remains disposed on the substrate and laterally positioned between the individual semiconductor devices after etching wholly or partially through the sacrificial layer.

16. The method of claim 1, and wherein the one or more LEDs are microLEDs.

17. The method of claim 1, further comprising:

coupling device drivers to the one or more LED devices;

coupling a bus to the display;

coupling a processor to the bus to provide control instructions to the display; and coupling memory to the bus.

* * * * *